United States Patent
Brokaw

(10) Patent No.: US 6,956,727 B1
(45) Date of Patent: Oct. 18, 2005

(54) HIGH SIDE CURRENT MONITOR WITH EXTENDED VOLTAGE RANGE

(75) Inventor: A. Paul Brokaw, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 80 days.

(21) Appl. No.: 10/762,647

(22) Filed: Jan. 21, 2004

(51) Int. Cl.$^7$ .............................................. H02H 3/08
(52) U.S. Cl. ................... 361/93.7; 361/93.9; 361/91.1; 361/91.2; 326/127
(58) Field of Search ..................... 327/51–57; 330/250, 330/252, 261, 277; 361/57, 63, 91.1, 91.2, 361/93.7, 93.9

(56) References Cited

U.S. PATENT DOCUMENTS

| | | | |
|---|---|---|---|
| 5,220,207 A * | 6/1993 | Kovalcik et al. .............. | 327/63 |
| 5,892,647 A * | 4/1999 | Mizoe .......................... | 361/101 |
| 6,222,922 B1 * | 4/2001 | Scott et al. .................. | 379/377 |
| 6,785,521 B2 * | 8/2004 | Hadjichristos et al. ...... | 455/108 |

* cited by examiner

Primary Examiner—Vibol Tan
(74) Attorney, Agent, or Firm—Koppel, Jacobs, Patrick & Heybl

(57) ABSTRACT

A high side current monitor circuit includes an op amp which is coupled across a sensing element which carries a current $I_{sense}$ and develops a shunt voltage $V_{sense}$. A feedback transistor driven by the op amp output conducts an output current $I_{out}$ through a resistor to a current output node necessary to make the op amp inputs equal, such that $I_{out}$ is proportional to $I_{sense}$. $I_{out}$ is conducted through a resistor to generate a ground-referred voltage proportional to $V_{sense}$. When the common mode voltage of $V_{sense}$ is greater than the op amp's breakdown voltage, a discrete transistor is connected between the current output node and ground to stand off the voltage across the amp. The monitor circuit is arranged such that it can be powered with a limited fraction of the common mode voltage when used with a discrete transistor, and is self-biased when used without a discrete transistor.

27 Claims, 5 Drawing Sheets

HIGH SIDE CURRENT MONITOR WITH EXTENDED VOLTAGE RANGE

BACKGROUND OF THE INVENTION

1. Field of the Invention

This invention relates to the field of current monitors, and particularly to "high side" current monitors.

2. Description of the Related Art

A high side current monitor is designed to measure the signal current through a sensing element connected in series with a circuit's high side (as opposed to its return side). A shunt voltage proportional to the signal current is developed across the sensing element—typically a small resistor. The current monitor measures the differential voltage across the sensing element, and produces a ground or common-referred output that varies with the sensed current.

A conventional high side current monitor is shown in FIG. 1. A sensing element 10, here a resistor having a resistance $R_s$, is connected in series with a signal 12 having a voltage V1 and carries a current of interest $I_{sense}$ to a load 14; $R_s$ is typically on the order of 0.1 Ω. An operational amplifier A1 is connected across the sensing element, with its inverting input connected to the sensing element's load side, and its non-inverting input connected to the sensing element's high side via a resistor 15 having a resistance R1. A feedback transistor Q0, here a NPN, has its base connected to the output of A1, its collector connected to the junction of R1 and A1's non-inverting input, and its emitter providing an output $I_{out}$. $I_{out}$ is delivered to an output resistor 16 having a resistance $R_{out}$ to produce an output voltage $V_{out}$.

In operation, $I_{sense}$ develops a shunt voltage $V_{sense}$ across $R_s$; A1 responds by causing Q0 to conduct a current through R1 necessary to equalize A1's inverting and non-inverting inputs. This current ($I_{out}$) is proportional to the voltage ($V_{sense}$) across—and thus to the current ($I_{sense}$) through—sensing element 10. As output voltage $V_{out} = I_{out}R_{out}$, it is also proportional to current of interest $I_{sense}$.

When the current is sensed on the high side of a circuit (as in FIG. 1), the differential voltage applied to A1 can have a large common mode potential. An op amp IC has an associated breakdown voltage determined by its fabrication process, which limits its common mode input range—which in turn limits the signals with which the current monitor of FIG. 1 can be safely used.

SUMMARY OF THE INVENTION

A high side current monitor circuit is presented which overcomes the problems noted above.

The present high side current monitor circuit includes components of the monitor described above: a sensing element is connected between high and load side terminals, carries a current of interest $I_{sense}$, and develops a shunt voltage $V_{sense}$ between the terminals in response to $I_{sense}$. An op amp's non-inverting input is coupled to the load side terminal, and a resistor is connected between the high side terminal and the amplifier's inverting input. A feedback transistor is connected to the op amp's output and conducts an output current $I_{out}$ through the resistor to a current output node necessary to make the voltages at the amp's inverting and non-inverting inputs equal—such that $I_{out}$ is proportional to $I_{sense}$.

The present current monitor circuit may also include an output load resistor connected between a second node and ground, and a second transistor coupled between the current output node and the second node and connected to conduct $I_{out}$ to the output load resistor such that a ground-referred voltage proportional to $V_{sense}$ is developed at the second node. The op amp and feedback transistor are preferably contained within an integrated circuit (IC) package, while the second transistor is preferably external to the IC and fabricated with a high voltage process. When so arranged, the external transistor stands off most of the common mode voltage, thereby reducing the voltage across the IC to less than the breakdown voltage associated with the IC's fabrication process. This permits measurement of shunt voltages having common mode voltages in excess of the breakdown voltage.

The discrete transistor can be a P-type field-effect transistor (FET) or a PNP bipolar. If the latter, the invention preferably includes a base current recycling circuit which corrects for errors that would otherwise arise due to the external transistor's base current.

The current monitor circuit may be configured as a "dual-use" IC, which can be used either with or without a discrete external transistor. The monitor circuit is further arranged such that it can be powered with a limited fraction of the common mode voltage when used with an external transistor, and is self-biased when used without an external transistor.

Further features and advantages of the invention will be apparent to those skilled in the art from the following detailed description, taken together with the accompanying drawings.

DETAILED DESCRIPTION OF THE INVENTION

Figure 1:
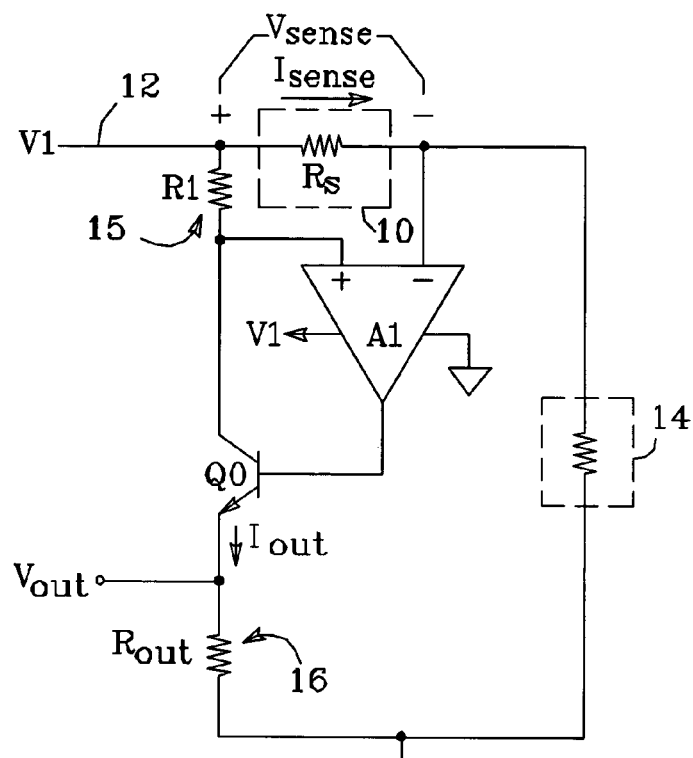
FIG. 1 is a schematic diagram of a known high side current monitor.
Figure 2:
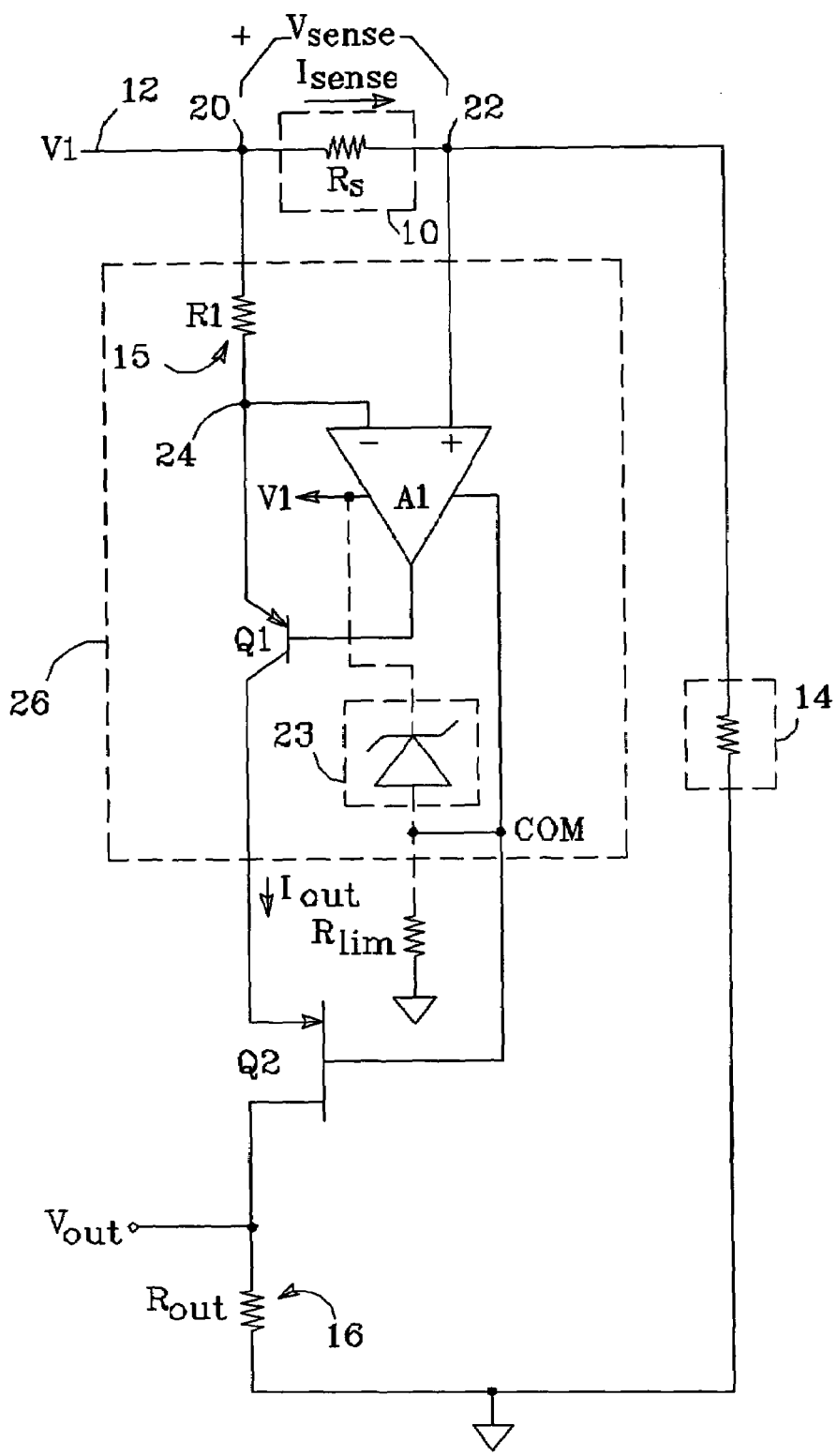
FIG. 2 is a schematic diagram of a high side current monitor per the present invention.

One embodiment of a high side current monitor circuit in accordance with the present invention is shown in FIG. 2. As described above in relation to FIG. 1, the circuit comprises a sensing element 10, typically a resistor having a resistance $R_s$ (though other devices having a known impedance could also be used), connected between high side and load side terminals 20 and 22 and in series with a signal 12 having a voltage V1. $R_s$ carries a current $I_{sense}$ to a load 14. Op amp A1 is connected across sensing element 10, with its non-inverting input coupled to load side terminal 22 and its inverting input connected to high side terminal 20 via a resistor 15 having a resistance R1. A1 may be powered between V1 and a local circuit common point (COM). Alternatively, the present monitor circuit can include a voltage limiter 23, which, when coupled to ground via a resistance $R_{lim}$, enables A1 to be powered from a voltage much lower than the signal common mode voltage. A feedback transistor Q1, here a PNP bipolar (though a FET could also be used), has its base connected to the output of A1, its emitter connected to the junction (24) of R1 and A1's non-inverting input, and its collector providing an output current $I_{out}$. In operation, $I_{sense}$ develops a shunt voltage $V_{sense}$ across $R_s$; A1 responds by causing Q1 to conduct current $I_{out}$ through R1 necessary to equalize A1's inverting and non-inverting inputs, such that $I_{out}$ is proportional to $V_{sense}$ and $I_{sense}$.

As noted above, when the current being monitored is sensed on the high side of a circuit (as here), the differential voltage applied to A1 can have a large common mode potential. An op amp IC has an associated breakdown voltage determined by its fabrication process (referred to herein as the "process breakdown voltage"), which limits its common mode input range—which in turn limits the signals with which the current monitor circuit can be safely used.

The invention overcomes this limitation with the addition of a transistor Q2, which is connected to conduct output current $I_{out}$ to output resistor 16, the other side of which is connected to ground. The voltage developed across resistor 16 is the circuit's output voltage $V_{Out}$.

Components A1, Q1 and R1 are preferably housed within an IC 26, and Q2 is preferably a discrete transistor external to IC 26. When so arranged, the IC portion 26 can be biased so that most of the voltage between V1 and ground is stood off by transistor Q2, instead of being mostly across Q1 and A1 as in the prior art. Q2 is preferably made with a high voltage process, so that the monitor circuit can tolerate a $V_{sense}$ having a common mode voltage in excess of the process breakdown voltage. Voltage limiter 23 limits the voltage which can be made to appear across A1, and Q2 stands off most of the remaining common mode voltage—thereby enabling the measurement of a small shunt voltage ($V_{sense}$) having a common mode voltage in excess of the process breakdown voltage.

Figure 3:
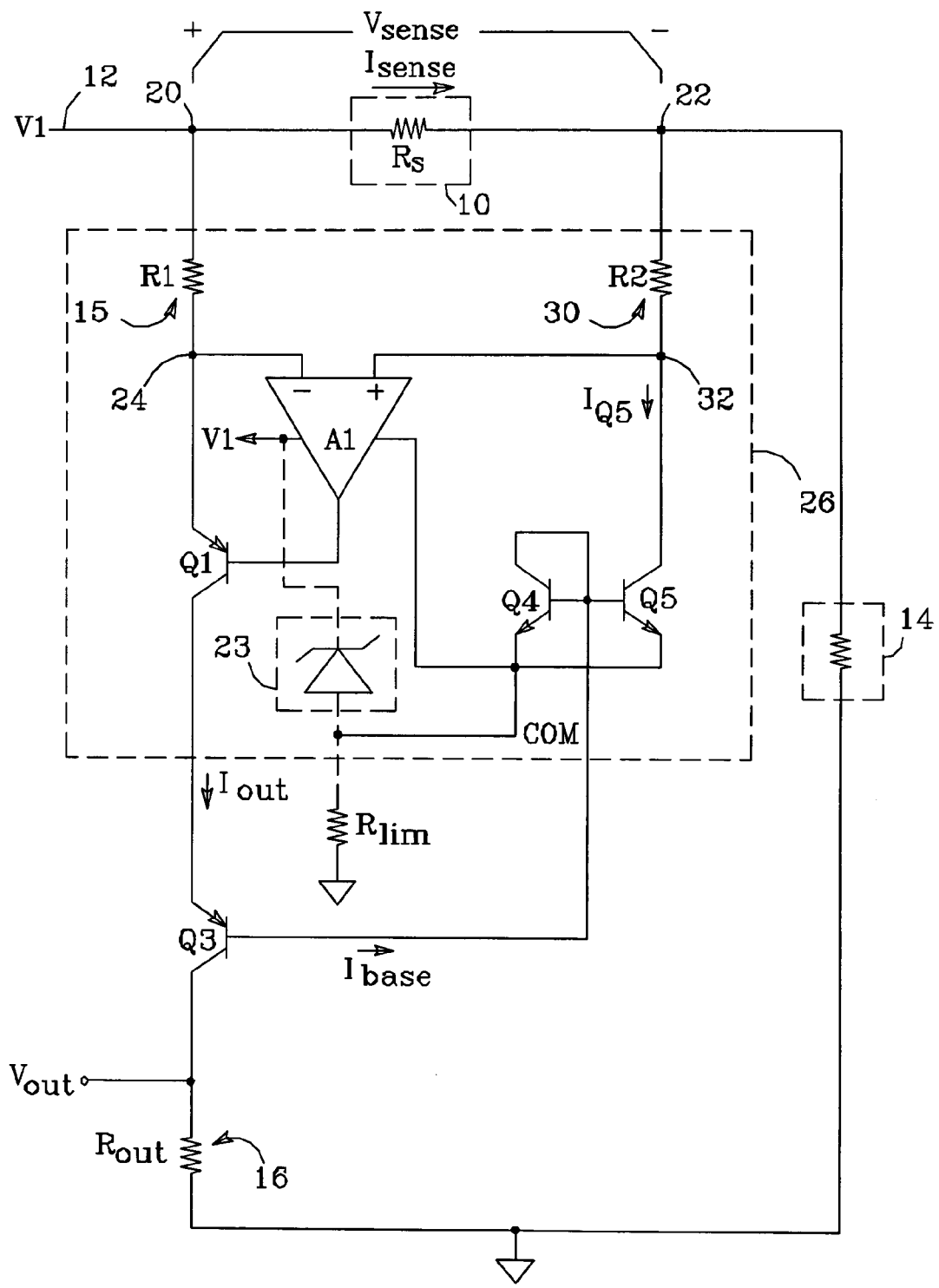
FIG. 3 is a schematic diagram of another embodiment of a high side current monitor per the present invention.

Transistor Q2 is preferably a P-type FET (as shown in FIG. 2), or a PNP bipolar (described below and shown in FIG. 3). If a PFET is used, its gate should be connected to circuit common point COM, and the monitor circuit must be arranged such that the voltage between V1 and COM is sufficient to allow A1 to drive Q1 and for the collector of Q1 to drive Q2 to the gate-source voltage needed for Q2 to conduct $I_{out}$ to $R_{out}$.

If the discrete external transistor is a PNP bipolar transistor, the magnitude of $I_{out}$ conducted to output resistor 16 will be reduced by the PNP's base current, resulting in an error in $V_{out}$. The invention preferably includes a base current recycling circuit to reduce or eliminate this error. A preferred arrangement is shown in FIG. 3. Here, the discrete external transistor is a PNP bipolar transistor Q3. Q3's base is connected to a simple current mirror, made from transistor Q4 (diode-connected) and Q5, each of which is referenced to A1's circuit common point (COM). A resistor 30 having a resistance R2 approximately equal to R1 is interposed between load side terminal 22 and A1's non-inverting input, and the collector of Q5 is connected to the junction 32 of R2 and A1.

In operation, Q3's base current $I_{base}$ biases Q4 so that its base voltage biases Q5 such that Q5 conducts a current $I_{Q5}$ nearly equal to $I_{base}$ (assuming a 1:1 mirror). Current $I_{Q5}$ is conducted through resistance R2. The component of voltage that results from this displaces A1's non-inverting input by a small amount. A1 responds by driving the base of Q1 to force a similar displacement across R1. This adds an increment of current to the signal current in R1, thereby increasing $I_{out}$. Since the Q5 current is approximately equal in magnitude to Q3's base current $I_{base}$, and the displacements across R2 and R1 should result in equal currents, the increment of current added to the signal current should closely approximate the base current $I_{base}$, thereby correcting for the error that would otherwise arise due to Q3's base current.

When arranged as described above and with voltage limiter 23 in use, Q3 reduces the common mode voltage as follows. Assume that V1 is 20 volts with respect to ground, $R_{sense}$ is small such that the common mode voltage is ≈20 volts, $I_{out}$ is 100 μA, and $R_{out}$ has a resistance of 25 kΩ. If voltage limiter 23 limits the voltage across A1 to 5 volts, COM will be at 20−5=15 volts with respect to ground. The base-emitter junctions of Q4 and Q3 make the collector of Q1 approximately equal to 15+$V_{be(Q4)}$(≈0.6 v)+$V_{be(Q3)}$(≈0.6 v)= 16.2 volts with respect to ground—this is the voltage stood off by Q3. Now, the voltage across Q1 is ≈20−16.2= ≈3.8 volts. In this way, Q3 stands off a substantial portion of the common mode voltage, thereby reducing the voltage across A1 to that portion of the common mode voltage which the voltage limiter permits. If Q3 were not present, the voltage across Q1 would be ≈20−2.5 volts= ≈17.5 volts, which might exceed the process breakdown voltage. Note that COM is the most negative of all the terminals, so that no more than 5 volts difference can appear anywhere inside the IC.

Figure 4A:
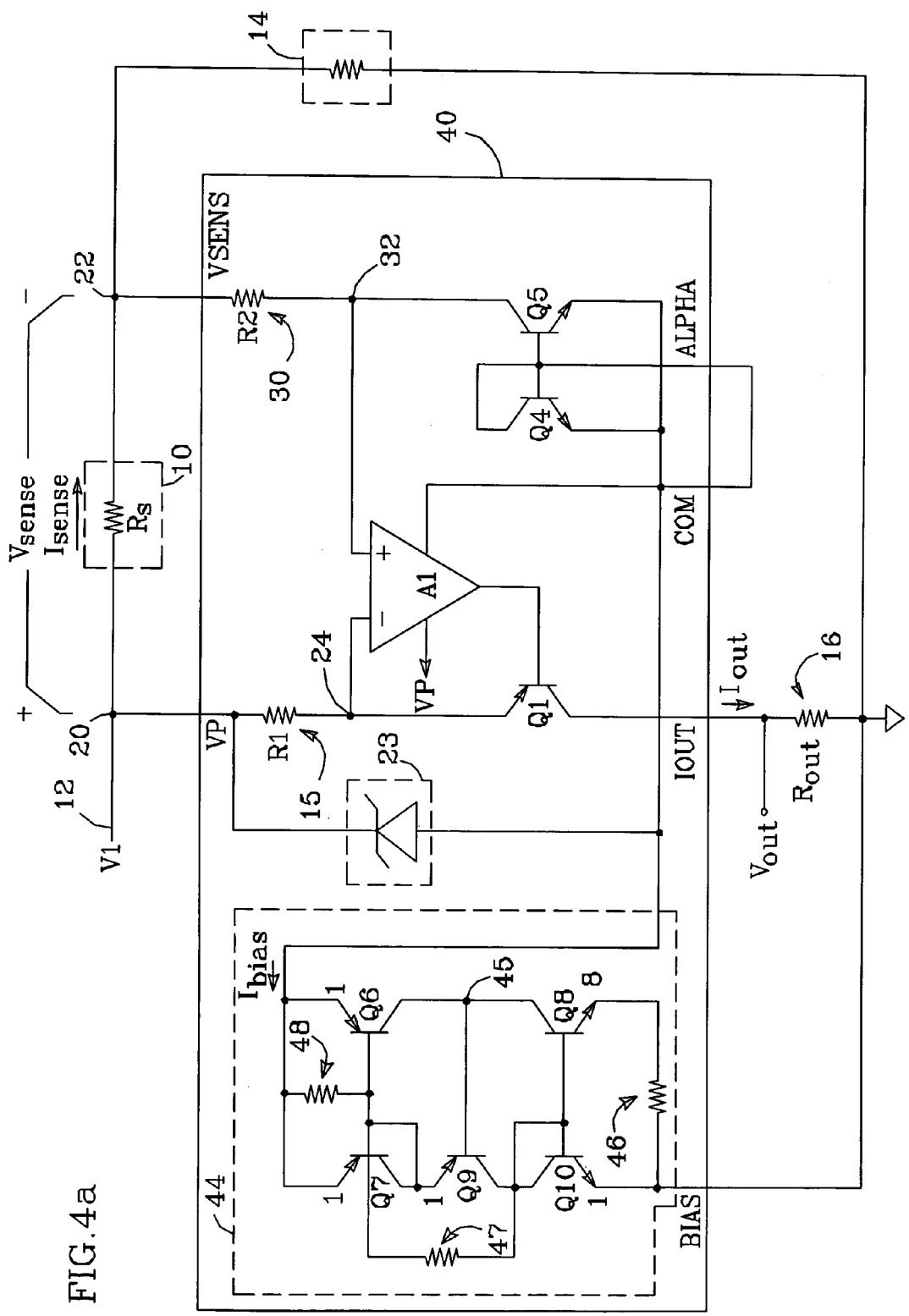
FIG. 4A is a schematic diagram of a dual-use IC implementation of the present high side current monitor, in one of its two applications.

The present current monitor circuit is suitably configured as a "dual-use" IC, which can be used when the common mode potential of $V_{sense}$ is greater than or less than the process breakdown voltage. Such an IC 40 is shown employed in its two uses in FIGS. 4A and 4B. IC 40 is connected to high side terminal 20 and load side terminal 22 via I/O pins VP and VSENS, respectively, which are also connected to resistors 15 and 30. In FIG. 4A, the common mode potential of $V_{sense}$ is expected to be less than the process breakdown voltage. In this case, there is no need for an external discrete transistor to stand off the voltage across A1, so output current $I_{out}$ is connected directly to output resistor 16 (via an I/O pin IOUT) to generate VOUT. With no external discrete transistor, there is no external base current error to correct for; thus, the input to the Q4/Q5 current mirror (an I/O pin ALPHA) is simply connected to A1's circuit common point COM (brought out to an I/O pin COM) to deactivate the mirror.

IC 40 preferably includes circuitry which allows it to be self-biased when the common mode potential of $V_{sense}$ is within the IC's safe operating range; one possible embodiment of such circuitry is shown in FIG. 4A. A voltage limiter 23 connected between V1 and COM provides A1's operating voltage; A1's operating current is set with a current $I_{bias}$ generated with a bias circuit 44. Bias circuit 44 preferably comprises a PNP transistor Q6 having its emitter connected to COM and voltage limiter 23, and a PNP transistor Q7 having its base and emitter connected in common with the base and emitter of Q6. The collector of Q6 is connected to the collector of an NPN transistor Q8 at a node 45, and the collector and base of Q7 are connected to the emitter of a PNP transistor Q9. The base of Q9 is connected to node 45, and Q9's collector is connected to the collector of a diode-connected NPN transistor Q10 having its base connected in common with the base of Q8 and its emitter connected to Q8's emitter via an emitter degeneration resistor 46. A resistor 47 is connected between Q7's base and Q9's collector, and a resistor 48 is connected between the emitter and base of Q6/Q7. The bias circuit is connected to an I/O pin BIAS at Q10's emitter.

In operation, resistor 46 in the emitter circuit of Q8 makes the emitter voltages of Q8 and Q10 different. Q8 is made larger than Q10 (8 times larger in FIG. 4A), so that in the absence of resistor 48, the Wilson current mirror composed of Q6, Q7, and Q9 could force Q10 to operate at the same current as Q8. In this case Q8 and Q10 would operate at a fixed current density ratio of 8, causing a voltage (kT/q) ln8≈54 mV at room temperature to appear across resistor 46. This known temperature proportional voltage determines the magnitude of the equal currents in inverse proportion to resistor 46. Neglecting resistors 47 and 48, bias current $I_{bias}$ would be the sum of the equal proportional-to-absolute-temperature (PTAT) currents in Q8 and Q10. Adding resistor 48 provides an additional component of current in Q9 since it must drive resistor 48 until the voltage across it makes the base-emitter voltage for Q6. This current complements the PTAT current with a complementary-to-absolute-temperature (CTAT) current so that the total bias current is nearly temperature-invariant. Resistor 47 has been added to insure that current in Q10 cannot be zero.

When the common mode potential of $V_{sense}$ is expected to be less than the process breakdown voltage, the BIAS pin is connected to ground, which puts most of input voltage V1 across bias circuit 44; this enables the bias circuit such that it provides $I_{bias}$ to IC 40. Bias circuit 44 should be arranged to provide an $I_{bias}$ having a magnitude sufficient to operate the IC, but no more than the voltage limiter's maximum allowable current. The voltage limiter is preferably arranged to stabilize A1's operating voltage near the minimum that it needs.

Figure 4B:
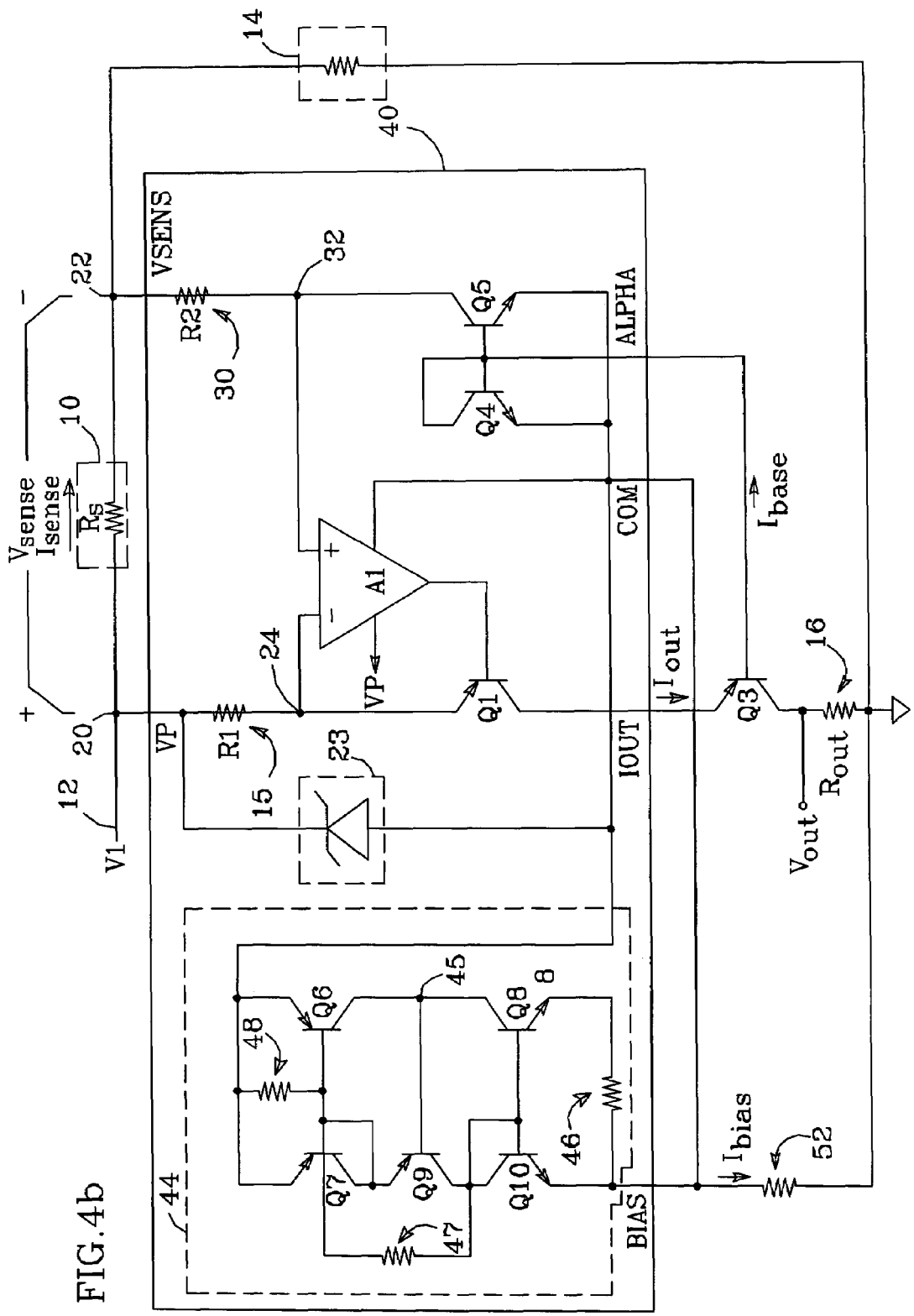
FIG. 4B is a schematic diagram of a dual-use IC implementation of the present high side current monitor, in the other of its two applications.

FIG. 4B illustrates the use of the IC when the common mode potential of $V_{sense}$ is greater than the process breakdown voltage. As discussed above in relation to FIGS. 2 and 3, an external discrete transistor Q3 stands off most of the common mode voltage, thereby reducing the voltage across A1 to that portion of the common mode voltage permitted by voltage limiter 23 and making the voltage across the IC less than the process breakdown voltage. In this application, the COM and BIAS pins are connected together, thereby disabling bias circuit 44, and a resistor 52 is connected between BIAS/COM and ground which provides $I_{bias}$ to IC 40. Resistor 52 is selected to provide an $I_{bias}$ current within the range described above. Voltage limiter 23 limits the voltage across A1 and the other IC circuits to protect them, but must allow enough voltage for A1 to operate, and for the added voltage required due to the drop across Q4 and the forward-biased Q3 base-emitter voltage.

Thus, the present current monitor may be used as a stand-alone IC for use in low voltage applications, or in an extended voltage application by adding an external discrete transistor (Q2/Q3) and a resistor (52). The invention further enables the IC to be fabricated using a basic low voltage process.

Note that while the bias circuit implementation shown in FIGS. 4A and 4B is preferred, many other circuits could be employed to establish appropriate operating points for IC 40.

Figure 5:
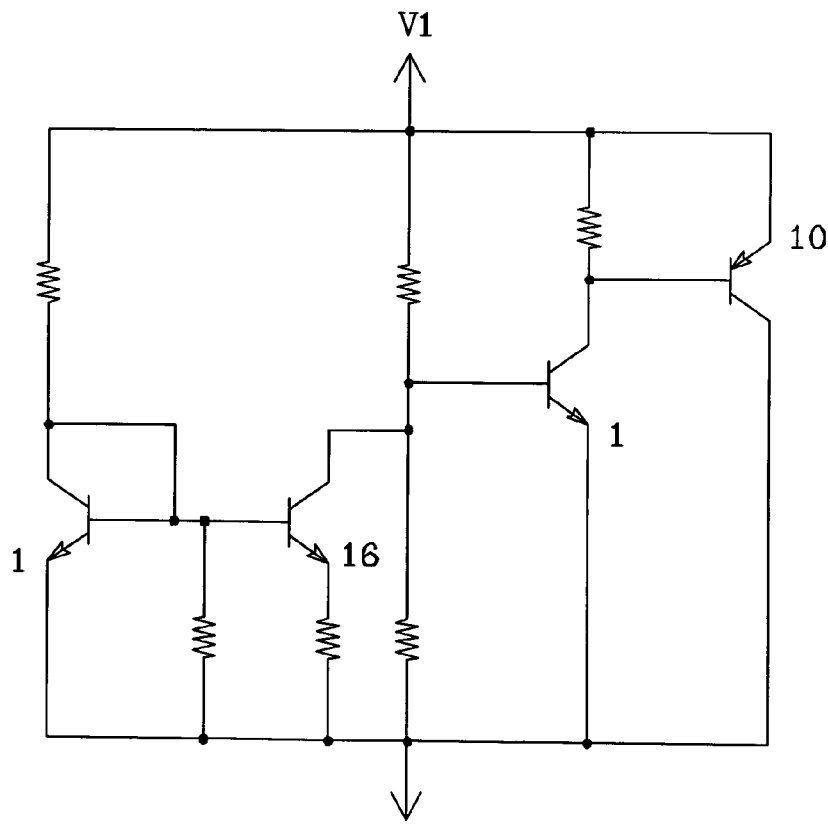
FIG. 5 is a schematic diagram of a bandgap shunt regulator as might be used with the present high side current monitor.

Also note that voltage limiter 23 could be implemented in many different ways. For example, a zener diode (as shown in FIGS. 2–4) or an avalanche breakdown diode could be used. Another possibility is to use an electronic bandgap shunt regulator; one possible embodiment of such a regulator is shown in FIG. 5.

While particular embodiments of the invention have been shown and described, numerous variations and alternate embodiments will occur to those skilled in the art. Accordingly, it is intended that the invention be limited only in terms of the appended claims.

I claim:

1. A high side current monitor circuit, comprising:
   a high side terminal;
   a load side terminal;
   a current sensing element connected between said high and load side terminals which carries a current of interest $I_{sense}$ and which develops a shunt voltage $V_{sense}$ between said high side and load side terminals in response to $I_{sense}$, said shunt voltage having a common mode voltage $V_{cm}$ with respect to a ground terminal;
   an operational amplifier, said amplifier's non-inverting input coupled to said load side terminal;
   a first resistor connected between said high side terminal and said amplifier's inverting input;
   a first transistor having a control input and a current circuit, said control input connected to the output of said amplifier and said current circuit connected between said inverting input and a current output node such that said first transistor conducts an output current $I_{out}$ through said first resistor to said current output node necessary to make the voltages at said inverting and non-inverting inputs equal such that $I_{out}$ is proportional to $I_{sense}$;
   an output load resistor connected between a second node and said ground terminal; and
   a second transistor coupled between said current output node and said second node and connected to conduct said output current to said load resistor such that a voltage proportional to $I_{sense}$ and referred to said ground terminal is developed at said second node.

2. The current monitor circuit of claim 1, wherein said amplifier, first resistor and first transistor comprise an integrated circuit (IC) having an associated process breakdown voltage, said second transistor and said output load resistor standing off a substantial portion of said common mode voltage such that the common mode voltage to which said IC is subjected is less than said process breakdown voltage.

3. The current monitor circuit of claim 2, wherein said amplifier is operated with an operating voltage referred to a common terminal and said second transistor is a P-type field-effect transistor (PFET) having its source connected to said current output node, its drain connected to said second node, and its gate connected to said common terminal.

4. The current monitor circuit of claim 2, wherein said second transistor is a PNP bipolar transistor having its emitter connected to said current output node and its collector connected to said second node, said current monitor circuit further comprising a base current recycling circuit arranged to cause the current in said first resistor to be incremented by an amount approximately equal to said second transistor's base current.

5. The current monitor circuit of claim 4, wherein said base current recycling circuit comprises:
   a third resistor interposed between said load side terminal and said amplifier's non-inverting input and having a resistance approximately equal to that of said first resistor; and
   a current mirror connected to the base of said second transistor and to said amplifier's non-inverting input such that said second transistor's base current is mirrored to said amplifier's non-inverting input and said mirrored current flows through said third resistor, such that said amplifier increments the current in said first resistor and thereby in $I_{out}$ by an amount approximately equal to said base current to equalize the voltages at its inverting and non-inverting inputs.

6. The current monitor circuit of claim 1, further comprising a voltage limiter coupled between said high side terminal and said common terminal which establishes an operating voltage for said amplifier and enables said amplifier to be powered from a voltage lower than $V_{cm}$.

7. The current monitor circuit of claim 6, further comprising a bias current source coupled to said common terminal which provides an operating current for said amplifier.

8. The current monitor circuit of claim 7, wherein said bias current source comprises a resistor connected between said common terminal and said ground terminal.

9. The current monitor circuit of claim 7, wherein said bias current source is a bias circuit comprising:
    a first PNP transistor having its emitter coupled to said common terminal;
    a second PNP transistor having its emitter connected to the emitter of said first PNP transistor, and its base and collector connected to the base of said first PNP transistor;
    a second resistor connected between the common bases and common emitters of said first and second PNP transistors;
    a first NPN transistor having its emitter connected to a bias terminal, said first NPN transistor diode-connected;
    a second NPN transistor having its base connected to the base of said first NPN transistor;
    a third resistor connected between the emitters of said first and second NPN transistors;
    a fourth resistor connected between the base of said second PNP transistor and the collector of said first NPN transistor; and
    a third PNP transistor having its emitter connected to the collector of said second PNP transistor, its collector connected to the collector of said first NPN transistor, and its base connected to the collector of said second NPN transistor;,
    the emitter of said second NPN transistor being larger than the emitter of said first NPN transistor.

10. The current monitor circuit of claim 9, wherein said bias terminal is connected to said ground terminal such that said bias circuit provides bias current to said common terminal.

11. The current monitor circuit of 6, wherein said voltage limiter comprises a zener diode.

12. The current monitor circuit of 6, wherein said voltage limiter comprises an avalanche breakdown diode.

13. The current monitor circuit of 6, wherein said voltage limiter comprises a bandgap shunt regulator.

14. A dual-use integrated circuit (IC) high side current monitor circuit suitable for use in measuring currents of interest having common mode voltages either above or below a predetermined process breakdown voltage, said IC comprising:
    a high side terminal;
    a load side terminal, said high and load side terminals suitable for connection across a current sensing element which carries a current of interest $I_{sense}$ and which develops a shunt voltage $V_{sense}$ between said high side and load side terminals in response to $I_{sense}$, said shunt voltage having a common mode voltage $V_{cm}$ with respect to an external ground terminal;
    an operational amplifier operated with an operating voltage referred to an IC common terminal, said amplifier having an associated breakdown voltage;
    a first resistor connected between said high side terminal and said amplifier's inverting input;
    a second resistor connected between said load side terminal and said amplifier's non-inverting input, said second resistor having a resistance approximately equal to that of said first resistor;
    a first transistor having a control input and a current circuit, said control input connected to the output of said amplifier and said current circuit connected between said inverting input and a current output terminal such that said first transistor conducts an output current $I_{out}$ through said first resistor to said current output terminal necessary to make the voltages at said inverting and non-inverting inputs equal such that $I_{out}$ is proportional to $I_{sense}$;
    a base current recycling circuit comprising an alpha terminal and arranged to cause the current in said first resistor to be incremented by an amount approximately equal to a current conducted at said alpha terminal;
    a voltage limiter coupled between said high side terminal and said IC common terminal which establishes an operating voltage and provides operating current for said amplifier, said operating current varying with a bias current applied to said IC at said common terminal; and
    a bias circuit coupled between said common terminal and a bias terminal and arranged to provide said bias current to said common terminal when enabled.

15. The dual-use IC of claim 14, further comprising:
    an output load resistor external to said IC connected between a second node and said external ground terminal; and
    a second transistor external to said IC coupled between said current output terminal and said second node and connected to conduct said output current to said load resistor such that a ground-referred voltage proportional to $I_{sense}$ is developed at said second node,
    said second transistor and said output load resistor standing off a substantial portion of said common mode voltage such that the common mode voltage to which said IC is subjected is less than said process breakdown voltage.

16. The dual-use IC of claim 15, wherein said second transistor is a P-type field-effect transistor (PFET) having its source connected to said current output node, its drain connected to said second node, and its gate connected to said IC common terminal.

17. The dual-use IC of claim 15, wherein said second transistor is a PNP bipolar transistor having its emitter connected to said current output node, its collector connected to said second node, and its base connected to said alpha terminal, such that the current in said first resistor is incremented by an amount approximately equal to said second transistor's base current.

18. The dual-use IC of claim 15, wherein said base current recycling circuit comprises a current mirror connected to an "alpha" terminal and to said amplifier's non-inverting input such that a current conducted at said alpha terminal is mirrored to said amplifier's non-inverting input and said mirrored current flows through said second resistor, such that said amplifier increments the current in said first resistor by an amount approximately equal to said current conducted at said alpha terminal.

19. The dual-use IC of claim 14, wherein said bias circuit comprises:
   a first PNP transistor having its emitter coupled to said common terminal;
   a second PNP transistor having its emitter connected to the emitter of said first PNP transistor, and its base and collector connected to the base of said first PNP transistor;
   a third resistor connected between the common bases and common emitters of said first and second PNP transistors;
   a first NPN transistor having its emitter connected to said bias terminal, said first NPN transistor diode-connected;
   a second NPN transistor having its base connected to the base of said first NPN transistor;
   a fourth resistor connected between the emitters of said first and second NPN transistors;
   a fifth resistor connected between the base of said second PNP transistor and the collector of said first NPN transistor; and
   a third PNP transistor having its emitter connected to the collector of said second PNP transistor, its collector connected to the collector of said first NPN transistor, and its base connected to the collector of said second NPN transistor;
   the emitter of said second NPN transistor being larger than the emitter of said first NPN transistor.

20. The dual-use IC of claim 19, wherein said bias terminal is connected to said ground terminal such that said bias circuit is enabled and provides said bias current to said common terminal.

21. The dual-use IC of claim 19, wherein said bias terminal is connected to said common terminal such that said bias circuit is disabled, further comprising a resistor connected between said bias and common terminals and said ground terminal such that said resistor provides said bias current to said common terminal.

22. The dual-use IC of claim 19, further comprising:
   an output load resistor external to said IC connected between a second node and said external ground terminal; and
   a second transistor external to said IC coupled between said current output terminal and said second node and connected to conduct said output current to said load resistor such that a ground-referred voltage proportional to $I_{sense}$ is developed at said second node;
   said second transistor and said output load resistor standing off a substantial portion of said common mode voltage such that the common mode voltage to which said IC is subjected is less than said process breakdown voltage;
   said bias terminal connected to said common terminal such that said bias circuit is disabled, further comprising a resistor connected between said bias and common terminals and said ground terminal such that said resistor provides said bias current to said common terminal.

23. The dual-use IC of claim 19, further comprising an output load resistor external to said IC connected between said current output terminal and said external ground terminal such that a ground-referred voltage proportional to $I_{sense}$ is developed at said current output terminal, said bias terminal connected to said ground terminal such that said bias circuit is enabled and provides said bias current to said common terminal.

24. The dual-use IC of claim 14, further comprising an output load resistor external to said IC connected between said current output terminal and said external ground terminal such that a ground-referred voltage proportional to $I_{sense}$ is developed at said current output terminal.

25. The dual-use IC of claim 14, wherein said voltage limiter comprises a zener diode.

26. The dual-use IC of claim 14, wherein said voltage limiter comprises an avalanche breakdown diode.

27. The dual-use IC of claim 14, wherein said voltage limiter comprises a bandgap shunt regulator.

* * * * *